United States Patent [19]
Loh et al.

[11] Patent Number: 5,759,901
[45] Date of Patent: Jun. 2, 1998

[54] FABRICATION METHOD FOR SUB-HALF MICRON CMOS TRANSISTOR

[75] Inventors: Ying-Tsong Loh, Saratoga; Lily Ding, Fremont, both of Calif.

[73] Assignee: VLSI Technology, Inc., San Jose, Calif.

[21] Appl. No.: 905,234

[22] Filed: Aug. 1, 1997

Related U.S. Application Data

[63] Continuation of Ser. No. 417,638, Apr. 6, 1995, abandoned.

[51] Int. Cl.$^6$ ................................................ H01L 21/336
[52] U.S. Cl. .................... 438/305; 438/231; 438/291; 438/303; 438/217
[58] Field of Search ......................... 438/305, 231, 438/291, 303, 217

[56] References Cited

U.S. PATENT DOCUMENTS

| | | | |
|---|---|---|---|
| 5,146,291 | 9/1992 | Watabe et al. | 437/44 |
| 5,162,884 | 11/1992 | Liou et al. | 437/233 |
| 5,219,777 | 6/1993 | Kang | 437/44 |
| 5,278,441 | 1/1994 | Kang et al. | 437/34 |
| 5,320,974 | 6/1994 | Hori et al. | 437/35 |
| 5,384,279 | 1/1995 | Stolmeijer et al. | 437/34 |
| 5,429,958 | 7/1995 | Matlock | 437/34 |
| 5,489,543 | 2/1996 | Hong | 437/29 |

FOREIGN PATENT DOCUMENTS

| | | | |
|---|---|---|---|
| 0239540 | 2/1990 | Japan | 437/29 |
| 2298023 | 12/1990 | Japan | 437/44 |
| 5326552 | 12/1993 | Japan | 437/913 |

OTHER PUBLICATIONS

Wolf, "Silicon Processing for the VLSI Era", vol. 3, 1995, pp. 539–552.

Wolf, "Silicon Processing for the VLSI Era", vol. 2, 1990, pp. 144–150.

Codella and Ogura, "Halo Doping Effects in Submicron DI–LDD Device Design," *IEDM 85*, 1985, pp. 230–233.

Takashi, "1/4–μm LATID (Large–Tilt–angle Implanted Drain) Technology for 3.3–V Operation," *IEDM 89*, 1989, pp. 777–780.

Simonton and Sinclair, *Emerging Ion Implantation Processes for the 1990s*, Jul. 1990, pp. 1–69.

Nowak, Johnson, Hong, Han, Wang, Loh and Hu, "Optimization of Punchthrough Effects for Deep Submicron N–channel MOSFETs," *Third International Conference on Solid State and Integrated Circuit Technology*, Oct. 1992, pp. 160–162.

Nowak, Ding, Loh, Hong and Hu, "An Arsenic LDD for 3.3 Volt N–channel MOSFET Applications," *International Semiconductor Device Research Symposium*, Dec. 1993, pp. 365–368.

*Primary Examiner*—Michael Trinh
*Attorney, Agent, or Firm*—Majestic, Parsons, Siebert & Hsue

[57] ABSTRACT

A technique for forming a high-performance sub-half micron MOS transistor is disclosed which has improved short channel characteristics without degradation of device performance. The transistor comprises a semiconductor substrate, a gate electrode, graded source and drain impurity regions, a first set of gate sidewall spacers, and a second set of gate sidewall spacers. The graded source and drain impurity regions comprise a relatively linear continuum of doped regions, ranging from lightly doped (LDD) regions, to moderately doped (MDD) regions, to heavily doped regions. Additionally, the transistor may include a punch through barrier region located within the substrate under the gate electrode. With these features, the transistor of the present invention allows for more precise control of conduction channel length without degradation of either (1) body factor and current drive, and/or (2) junction leakage, and without compromising hot carrier immunity.

39 Claims, 9 Drawing Sheets

FABRICATION METHOD FOR SUB-HALF MICRON CMOS TRANSISTOR

This is a continuation of Application Ser. No. 08/417,638 filed Apr. 6, 1995 now abandoned.

BACKGROUND OF THE INVENTION

1. Field of the Invention

The present invention relates to MIS (metal insulator semiconductor) transistors and particularly to an MIS transistor having an LDD (lightly doped drain) structure and a method of manufacturing thereof.

2. Description of the Prior Art

In order to accomplish large-scale integration and high reliability of semiconductor apparatus, it is indispensably necessary to reduce semiconductor devices of a semiconductor apparatus to microscopic sizes or to enhance performance thereof. A typical example of a semiconductor device is a MOS (metal oxide semiconductor) transistor as shown in FIG. 7A. Referring to FIG. 7A, a MOS transistor 1 comprises a gate electrode 4 of polysilicon or the like through a thin gate oxide film 3 on a surface of a silicon substrate 2. A pair of source and drain regions 5 and 6 are formed spaced from each other on the surface of the silicon substrate 2 with a gate electrode 4 being provided therebetween. A surface region of the silicon substrate 2 located between the source and drain regions 5 and 6 constitutes a channel region 7 of the MOS transistor 1.

The size of the MOS transistor 1 is reduced according to a scaling rule in order to realize a miniaturized structure without deteriorating the electric characteristics of the transistor. Thus, in this structure, a gate length of the gate electrode 4 or a channel length of the channel region 7 for example is reduced. However, this reduction of the structure involves a problem of a short channel effect which does not occur conspicuously in the prior art. More specifically, the reduction of the channel length causes concentration of an electric field near the drain region 6, resulting in deterioration of dielectric strength of the drain region. In addition, hot carriers generated by the concentration of electric field penetrate into the gate oxide films 3 and part of them are trapped or cause an interfacial potential. As a result, characteristic deteriorations such as a change of a threshold voltage $V_{TH}$ and lowering of transconductance and current drive can occur.

In order to solve such difficulties due to concentration of electric field obstructing fine reduction of a device structure, MOS transistors of an LDD structure have been proposed. FIG. 7B shows a structure of such an LDD MOS transistor. This structure of the LDD MOS transistor is shown, for example, in "Fabrication of High-Performance LDD FETs with Oxide Sidewall-Spacer Technology," by P. J. Tsang, *IEEE Transaction on Electron Devices*, Vol. ED-29 1982. Referring to FIG. 7B, the LDD MOS transistor has a double offset structure in which source and drain regions 5 and 6 include high-concentration n+ impurity regions 5a and 6a and low-concentration n– impurity regions 5b and 6b, respectively. This LDD structure is adopted particularly for the purpose of suppressing electric field concentration near the drain region 6. The n– impurity regions 5b and 6b are formed on side surfaces of the source and drain regions 5a and 6a, respectively, so that impurity concentrations in pn junction portions with the substrate may be changed gradually. Thus, a depletion layer generated during operation of the transistor extends toward the source and drain regions to attenuate electric field.

The above-described structure prevents breakdown between the drain region 6 and the channel region 7 and thus prevents deterioration of dielectric strength of the drain region 6. Further, the attenuation of electric field concentration serves to suppress generation of hot carriers. However, in the above-described LDD structure, another problem occurs that an on-resistance characteristic of the transistor is deteriorated. The low-concentration n– impurity regions 5b and 6b of the source and drain regions function as high-resistance regions because of the low impurity concentration. Consequently, the n– impurity regions 5b and 6b become parasitic resistances connected in series between the source and drain regions 5 and 6, causing lowering of drain current and deterioration of the n-resistance characteristic of the transistor.

Further, the influence of the parasitic resistance is strengthened by the structure in which the sidewalls 8 of the silicon oxide films are formed on the surfaces of the low-concentration n– source and drain regions 5b and 6b. More specifically, hot carriers having larger energy than that in a thermal equilibrium state are generated due to the electric field near the drain region 6. Those hot carriers are generated near the n– impurity region 6b of the drain region and some of them are injected in a lower portion of the sidewall 8 of the drain region. A surface region near the n– impurity region 6b is depleted with time due to an electric field caused by the hot carriers trapped at an energy level in the underlying oxide film of the sidewall 8. As a result, the threshold voltage $V_{TH}$ of the transistor is raised or conductance is decreased due to the depleted high-resistance portion of the n– impurity region 6b even in an operation state. Consequently, the drain characteristics are deteriorated and duration of reliability of the transistor practically utilizable is shortened.

Therefore, in order to prevent influence of hot carriers trapped in the sidewalls of the gate electrode, a transistor structure as shown in FIG. 7C has been proposed. This structure is the so-called gate overlapped LDD structure, in which a gate electrode is formed to overlap low-concentration impurity regions of the LDD structure. The structure of FIG. 7C is indicated in Japanese Patent Laying-Open No. 119078/1986. A transistor of a similar structure is disclosed in "The Impact of Gate-Drain Overlapped LDD (Gold) for Deep Submicron VLSI's," by R. Izawa, *Technical Digest of International Electron Devices Meeting*, p. 38 (1987) or in U.S. Pat. No. 4,727,038.

As shown in FIG. 7C, in a gate overlapped LDD MOS transistor, low-concentration n– impurity regions 5b and 6b of source and drain regions 5 and 6 are formed on a surface of a silicon substrate 2 under regions of a gate electrode 4. In such a gate electrode structure, if hot carriers generated near the drain 6 are injected into a gate oxide film 3, those hot carriers can be removed under the influence of electric field from the gate electrode 4. Consequently, the surfaces of the n– impurity regions 5b and 6b can be prevented from being depleted and having high resistance. Further, change in a threshold voltage and deterioration of transconductance and current can be prevented.

However, in such a gate overlapped LDD MOS transistor, a gate capacitance is increased by an amount corresponding to extended regions of the gate electrode 4 compared with the LDD MOS transistor shown in FIG. 7B. In other words, the capacitance portion formed by the gate electrode 4 over the n– impurity regions 5b and 6b, the gate oxide film 3 and the silicon substrate 2 causes the increase of the gate capacitance. As the result, responsiveness as the MOS transistor is lowered.

In a gate overlapped type of LDD MOS transistor, in some cases, boundary portions between n+ impurity regions 5a, 6a and n- impurity regions 5b and 6b are diffused under the gate electrode 4 by a thermal process of the manufacturing processes. In this case, regions where the end portions of the gate electrode 4 and the n+ impurity regions 5a and 6a are overlapped are formed. When thickness of the gate oxidization layer 3 becomes thin in such an overlapped region, tunneling occurs between the bands in a depleted drain region, whereby drain leak current is generated. Such a phenomenon is described in "IEDM Technical Digest," by T. Y. Chan et al. (1987).

As described in the foregoing, in conventional LDD MOS transistors, n- impurity regions become parasitic resistance due to hot carriers and gate capacitance generated in a gate overlapped type of LDD structure is increased or a drain leak current is generated. Accordingly, alternate device structures, including substrate and drain engineering, need to be investigated to overcome these problems as the devices are scaled down to smaller geometries.

SUMMARY OF THE INVENTION

These and additional objectives are accomplished by the various aspects of the present invention wherein, briefly, according to a principal aspect, a technique for forming a high-performance sub-half micron MOS transistor is disclosed which has improved short channel characteristics without degradation of device performance.

A first aspect of the present invention is directed to a technique for forming a MOS device which comprises a semiconductor substrate, a gate electrode, graded source and drain impurity regions, a first set of gate sidewall spacers, and a second set of gate sidewall spacers. The graded source and drain impurity regions comprise a relatively linear continuum of doped regions, ranging from lightly doped (LDD) regions, to moderately doped (MDD) regions, to heavily doped regions. In forming the transistor of the present invention according to this first aspect, the gate electrode is first formed, followed by implantation of the relatively low impurity concentration (LDD) source/drain regions. Then, a first set of sidewall spacers is formed adjacent to the gate, and the relatively moderate impurity concentration (MDD) source/drain regions are then implanted into the substrate adjacent to the LDD regions. Additionally, localized pocket regions for reducing short channel effect may also be implanted at this stage. Thereafter, the second set of sidewall spacers is formed around the gate adjacent to the outer portion of the first sidewall spacers. After formation of the second sidewall spacers, relatively high impurity concentration source/drain regions are then implanted adjacent to the moderately doped regions.

A second aspect of the present invention is directed to a MOS device comprising a semiconductor substrate, a gate electrode, source and drain impurity regions, at least one set of sidewall spacers, and a punch through barrier region located within the substrate under the gate electrode. The punch-through barrier region reduces undesirable effects due to punch-through phenomena, and is separate and distinct from other regions within the substrate (such as, for example, pocket implant regions) which may also be used to reduce the effects associated with punch-through phenomena. Unlike conventional implantation techniques, however, the formation of the punch-through barrier region of the present invention occurs before the formation of the gate oxide layer and the gate electrode. In this way a substantial portion of the punch-through barrier region may be formed under the yet-to-be-formed gate electrode without contaminating the gate oxide region. The punch-through barrier region is particularly well suited for sub-half micron technology because it improves punch-through characteristics without degradation on body factor and/or performance of the transistor.

The technique of forming the transistor of the present invention provides the following advantages, especially for sub-half micron technology. First, the transistor of the present invention significantly improves short-channel characteristics while maintaining acceptable subthreshold leakage. Additionally, the transistor of the present invention allows for more precise control of conduction channel length without degradation of either (1) body factor and current drive, and/or (2) junction leakage, and without compromising hot carrier immunity. Since there is no increase in source/drain junction capacitance, there is no degradation on performance, unlike conventional fabricated CMOS devices. As a result, a reliable deep/subhalf-micron MOS transistor with high performance can be constructed using the technique of the present invention.

Additional objects, features and advantages of the various aspects of the present invention will become apparent from the following description of its preferred embodiment, which description should be taken in conjunction with the accompanying drawings.

DETAILED DESCRIPTION OF THE PREFERRED EMBODIMENT

Figure 1A:
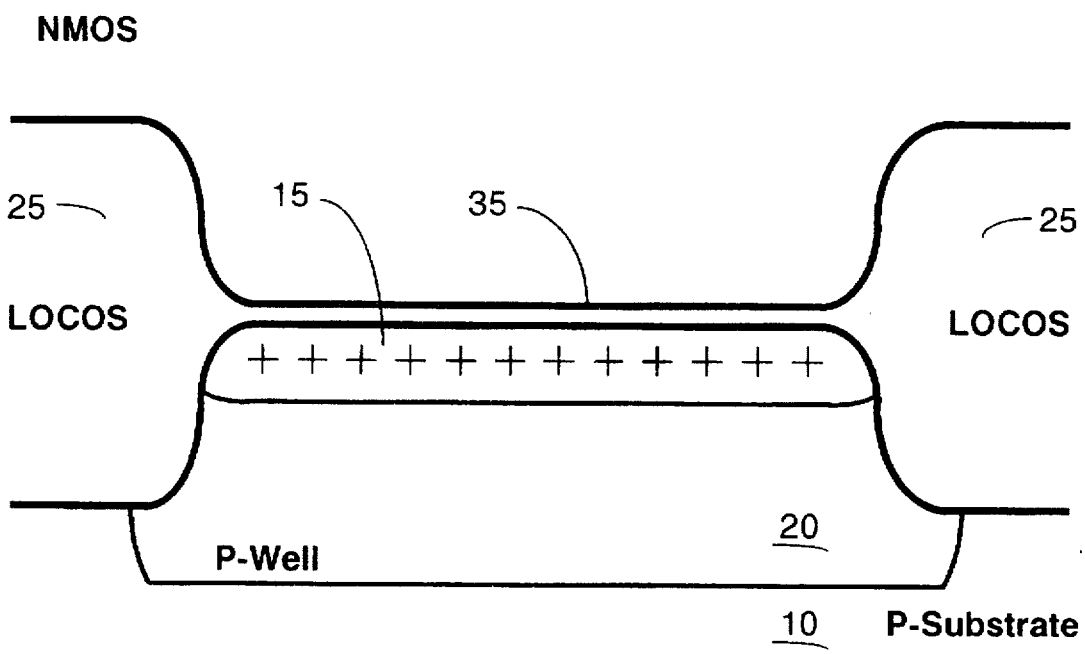
FIGS. 1–4 illustrate the various steps in forming a first embodiment of the transistor of the present invention, with the resulting transistor shown in FIGS. 4A and 4B.

CMOS device design involves the trade-off of yield, performance, and reliability. Conventional lightly doped drain (LDD) structures have been used to provide improved hot carrier immunity for several process generations of transistors from 1.5 microns down to 0.8 microns CMOS technology. However, large tilted angle (LATID) implantation techniques for LDD is needed to meet acceptable hot carrier lifetime for deep submicron (for example, 0.6 microns of less) devices for 5-volt applications. Additionally, in deep submicron regions (sub-0.5 microns), the reduction of the operating voltage (for example, from 5 volts to 3.3 volts) is the only resort to produce acceptable hot carrier immunity and to meet power consumption constraints for ultra-large-scaled integration (ULSI) products. However, the reduction of supply voltage will significantly decrease MOSFET drive current.

Standard scaling techniques only partially offset the current loss by thinning gate oxide thickness. As gate oxide thickness reduces below 100 Å, gate-induced drain leakage (GIDL) becomes a new design constraint. For low-power/low supply voltage ULSI packages, stringent off-state leakage is needed to improve battery-lifetime. To suppress threshold voltage roll-off and subthreshold leakage, and thus to reduce off-state leakage, requires the reduction of drain junction depth.

As MOSFET channel lengths are scaled down further below 0.5 microns and down to 0.35 microns, the channel punch-through and time-dependent dielectric breakdown of conventional thermal oxide become critical and dominant constraints limiting yield, reliability and performance for ULSI products, in addition to hot carrier effect (HCE), short channel effect (SCE), and gate-induced drain leakage (GIDL).

To meet hot carrier immunity and time-dependent dielectric breakdown (TDDB) requirements for sub-0.5 micron CMOS transistors, a supply voltage is preferably scaled down from 3.3 volts to 2.5 volts. To meet (or maintain) off-state leakage requirements for ULSI packages, the threshold voltage roll-off, subthreshold leakage, and GIDL for MOSFETs need to be maintained at the same level or even reduced further for a higher level of integration. Unfortunately, conventional lightly doped drain (LDD) structures for MOSFETs are becoming more difficult and impractical to reduce drain junction and to improve subthreshold characteristics, especially for buried PMOS. As the dimensions scale down to 0.35 microns, punch-through (PT) phenomena from source to drain appears as a critical device design constraint.

To partially compensate MOS drive current loss due to reduction of supply voltage (from 3.3 volts to 2.5 volts), the gate oxide thickness may be dropped below 65 Å. At that point, GIDL becomes increasingly severe and time-dependent dielectric breakdown (TDDB) phenomenon appears as a new device design constraint. Since scaled-down supply voltage cannot suppress the end result in these constraints, alternate dielectrics, beyond thermal oxide, are needed for sub-0.5 micron transistors. Although the following discussion related to alternative device structures for sub-0.5 micron transistors is limited to conventional thermally grown oxide, it is to be understood that other gate dielectrics commonly known to those skilled in the art may also be used.

It is desirable to improve punch-through characteristics in MOS devices as the devices are scaled down to smaller geometries (for example, from 0.5 microns to 0.35 microns ). In order to maintain process simplicity, and thus low wafer cost, a scaled-up well technique (i.e., heavier well) together with an LDD structure may be used to improve punch-through characteristics. However, as well concentration scales up, the body factor becomes poor, junction capacitance increases, and thus performance is degraded. Moreover, one of the more important design constraints for sub-0.5 micron device structures is to improve punch-through characteristics without degradation on body factor and/or performance of the device.

Graded LDD Device with Localized Pocket (HALO) Implants

In accordance with the above-described design constraints, a first embodiment of the present invention is provided which improves short channel characteristics, but does not degrade device performance. For purposes convenience and easy reference, this first embodiment of the present invention may be referred to as a graded LDD device with localized pocket (HALO) implants. The process steps for fabricating such a device are shown in FIGS. 1–4, which are described in greater detail below.

Figure 1B:
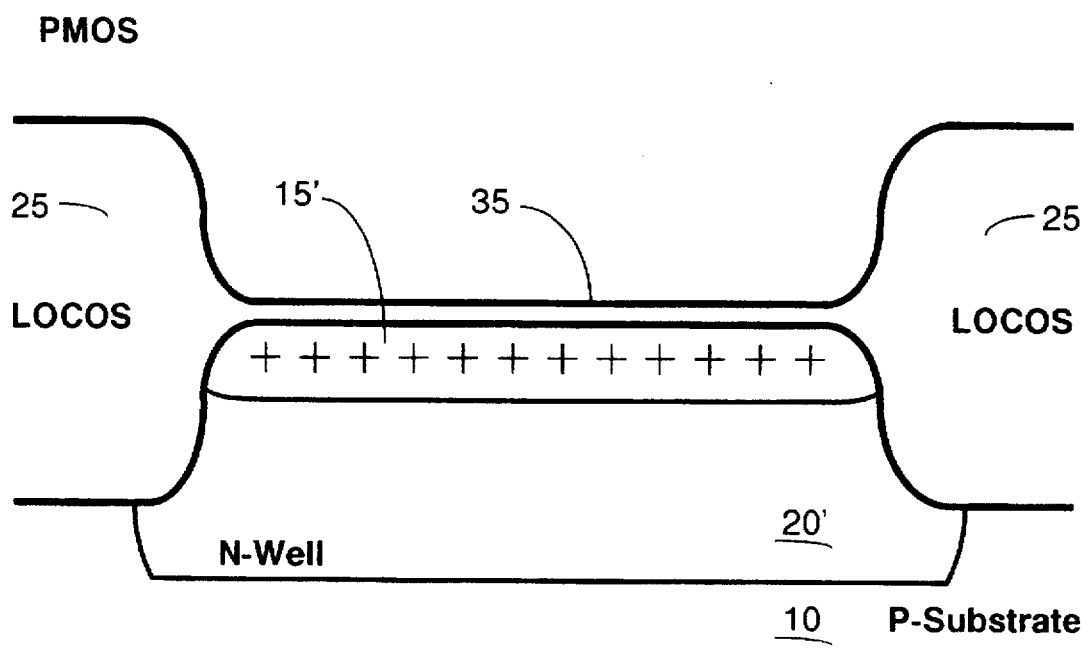

The structures shown in FIGS. 1A and 1B are formed in retrograde twin wells (P-well 20, and N-well 20') within a P-type common substrate 10. The P-substrate 10 is about 500 microns thick and has a resistivity of (5–8) ohm-cm. For convenience purposes, most of the discussion which follows is related to the formation of an NMOS transistor, with the understanding that such discussion is equally applicable to PMOS transistors, except where otherwise noted.

After an oxide insulating layer 25 is formed on the substrate by conventional local oxidation of silicon (LOCOS) process, retrograde wells 20 and 20' are then constructed by separate masking and implantation steps.

It is to be noted that the formation of retrograde wells 20 and 20' in the present invention differ from the conventional technique of implanting conventional twin wells. In the retrograde p-well process, for example, the well is implanted with a high energy boron implant as opposed to a thermal diffusion process. As a result of this step and the fact that the implant is made after field oxide formation, the p-well impurities do not diffuse from their original implanted position, thus reducing the lateral diffusion of the well. This enables reductions in the spacing between p-and n-transistors. Further advantage of the retrograde process is that junction depth, sheet resistance, and threshold voltage are independent, allowing separate adjustments to take place for optimizing the behavior of the CMOS devices. A more detailed discussion of retrograde well formation process is provided in *Principles of CMOS VLSI Design*, by Neil H. E. Weste and Kamran Eshraghian, Addison-Wesley Publishing Co., Menlo Park, Calif. 1985, herein incorporated by reference in its entirety.

Since conventional twin wells are formed using relatively low implant energy along with a high temperature drive-in (e.g., 1200° C.), such wells are formed to have a high concentration of dopant at the surface of the well, which tapers off relative to the junction depth of the well. The junction depth of conventional twin wells may be, for example, about 4 microns (which is considered relatively deep). The advantage of the conventional well technique is that the high surface concentration of dopant allows for easier and more consistent control of the threshold voltage of the transistor. Additionally, the use of relatively low implant energy is less costly than techniques which require high implant energy.

In contrast, the technique of the present invention for forming retrograde wells 20 and 20' employ a relatively high implant energy technique and a relatively low temperature drive-in (e.g., 1000° C.). In this way, the retrograde wells of the present invention has a lower surface dopant concentration which gradually increases relative to the junction depth. The dopant concentration may be at its maximum value at a depth of about 1–2 microns. Generally, the retrograde well has a shallow junction depth which typically does not exceed 2 microns. The advantage of using a retrograde well over conventional twin wells is that the reduction of dopant concentration at the surface of the retrograde well results in a transistor which has improved body factor characteristics and improved current drive characteristics. However, it is to be noted that as the dopant concentration at the surface of the well is lowered, this will cause the threshold voltage ($V_T$) to vary, making it more difficult to control and keep uniform the threshold voltage for each transistor. Because of this problem, and because the formation of a retrograde well requires high implantation energy, which is more costly, modern techniques for forming conventional short channel CMOS transistors typically use conventional twin wells rather than retrograde wells. Such a conventional technique, however, is contrary to the technique of the present invention.

For the formation of the retrograde N-well 20', phosphorous is implanted into the desired region according to the following implant conditions:

Energy($E$)=360 KeV, $Q$(dose)=(1.0–2.0)×10$^{13}$ cm$^{-2}$.

Formation of the retrograde P-well 20 is achieved by implanting boron in the desired region according to the following implant conditions:

Energy($E$)=200 KeV, $Q$(dose)=(0.5–1.5)×10$^{13}$ cm$^{-2}$.

After the respective dopants have been implanted into well regions 20 and 20', the wells are subjected to a low temperature anneal process (at about 1000 degrees C.). It is to be noted that such a low temperature annealing process is not used in the formation of conventional twin wells. Rather, to form conventional twin wells, a high temperature annealing process (at about 1200 degrees C.) is used, which causes greater diffusion of the dopant.

After the low temperature anneal process, a sacrificial oxide layer (not shown) of approximately 350 Å may then be thermally grown on the retrograde wells after removal of the remaining pad oxide formed during implant anneal.

Next, threshold voltage implants 15 and 15' are selectively performed using masking steps. Each threshold voltage implant ($V_T$) may be performed separately according to the following typical conditions:

NMOS $V_T$ implant: $BF_2$, 50 KeV, (1.0–2.5)×10$^{12}$ cm$^{-2}$.

PMOS $V_T$ implant: $BF_2$, 50 KeV, (2.0–5.0)×10$^{12}$ cm$^{-2}$.

After removing the sacrificial oxide layer, a layer of gate oxide 35 is thermally grown on exposed portions of the substrate. Preferably, the gate oxide thickness is about 65 Å.

Figure 2A:
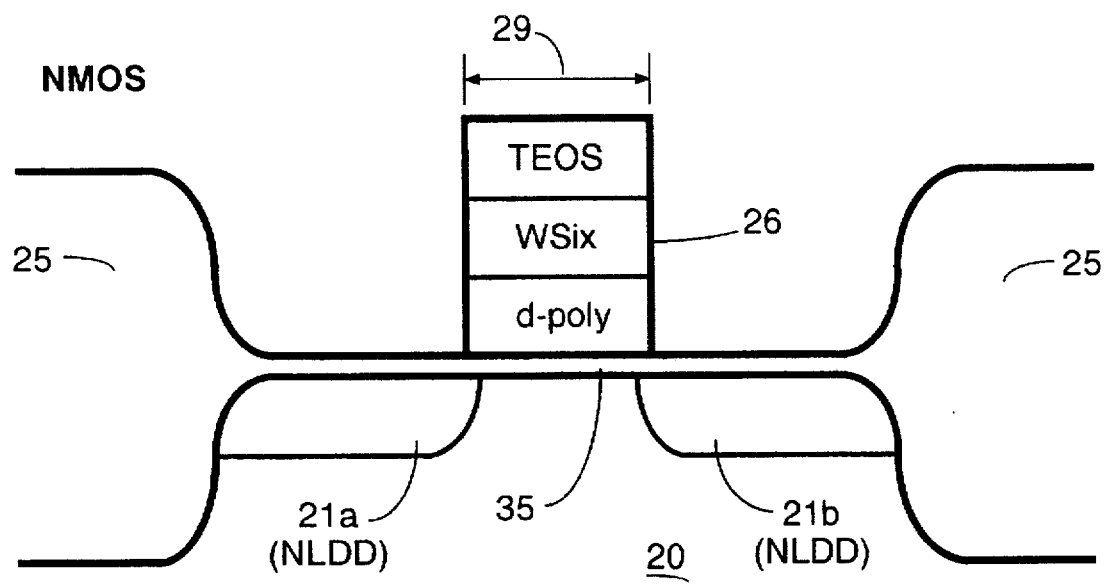
Figure 2B:
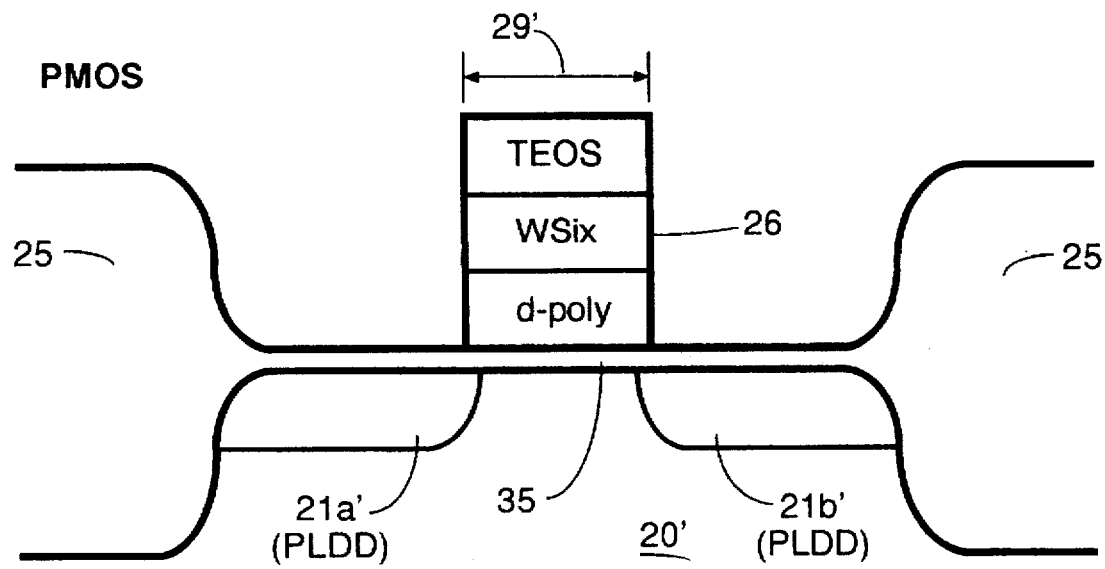

FIGS. 2A and 2B illustrate the next processing steps in forming the transistor of the present invention, wherein gate stacks 26 are respectively formed over wells 20 and 20'. As shown in FIGS. 2A and 2B, stack 26 comprises a plurality of layers which collectively form the gate portion of each transistor. The plurality of layers in stack 26 include a layer of TEOS, a layer of Tungsten silicide (WSix), and a layer of highly in-situ doped N-type polysilicon (d-poly). The thickness of each layer may, of course, vary depending upon the desired characteristics of the transistor.

The gate stack 26 is formed over the gate oxide layer 35 using a mask and plasma etch process. An example of the sequential deposition steps in forming the gate stack 26 is as follows. First, in-situ doped poly is formed using an LPCVD process. The poly layer may be formed to have a thickness of about 1,000 Å, and an N-dopant concentration of about 4×10$^{20}$cm$^{-3}$. Next, WSix is sputtered on top of the poly layer. The thickness of the WSix layer is also about 1,500 Å. Next, TEOS is deposited using an LPCVD process. The thickness of the TEOS layer is about 1,500 Å.

The conduction channel in each transistor is defined by the gate stack length, as indicated by 29 and 29'. In the preferred embodiment, the channel length 29 and 29' of each transistor is approximately 0.35 microns.

After the formation of the gate, lightly doped (N–) regions are then formed within each transistor using masking and implantation steps. In FIG. 2A, N-type lightly doped (N– or NLDD) source/drain regions 21$a$ and 21$b$ are formed by implanting arsenic or phosphorus in regions 21$a$ and 21$b$ according to the following implant conditions:

Energy($E$)=(30–60)KeV, $Q$(dose)=(1.0–2.0)×10$^{13}$ cm$^{-2}$.

P-type lightly doped (P– or PLDD) source/drain regions 21$a$' and 21$b$' are formed by implanting $BF_2$ in regions 21$a$' and 21$b$' according to the following implant conditions:

Energy($E$)=30KeV, $Q$(dose)=(1.0–2.0)×10$^{13}$ cm$^{-2}$.

Figure 3A:
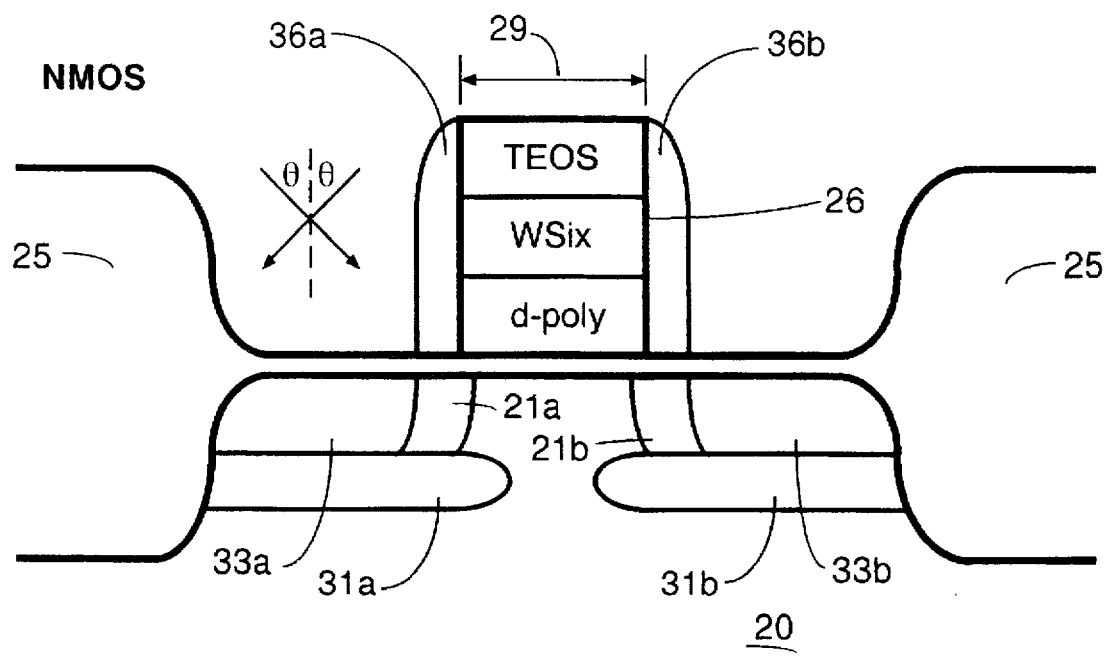
Figure 3B:
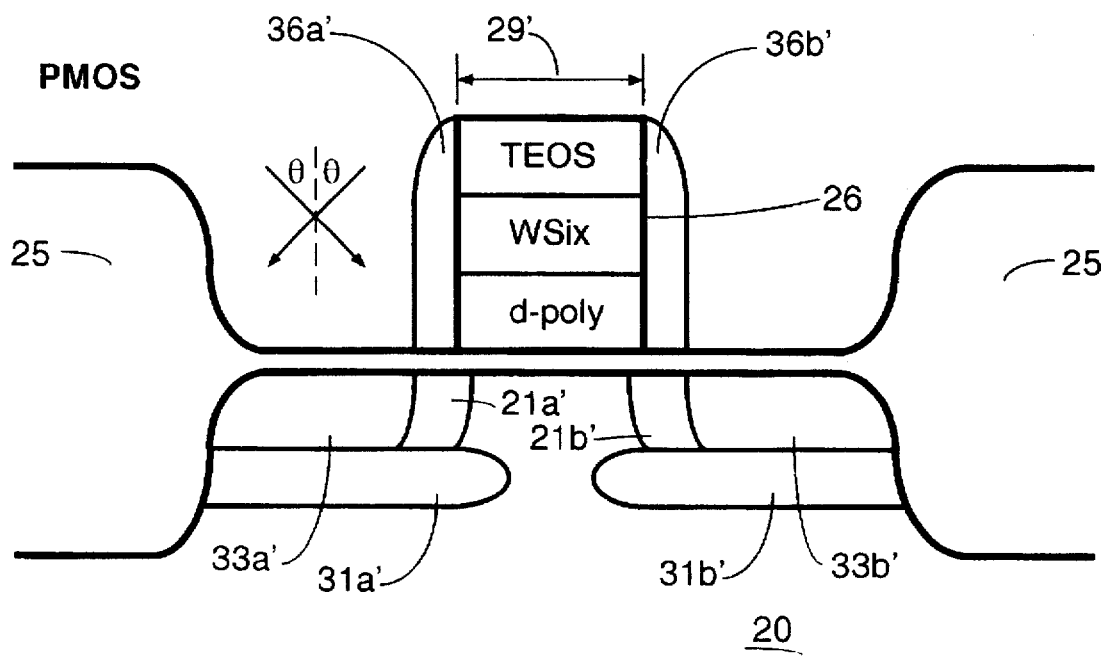

Next, as shown in FIGS. 3A and 3B, first sidewall oxide spacers 36$a$, 36$a$' and 36$b$, 36$b$' are formed simultaneously by deposition and then plasma etch back. Each of the first oxide spacers may have a thickness ranging from about 200 Å to about 1,000 Å. As described below, the formation of thin first sidewall spacers 36$a$, 36$b$ enable moderately doped source/drain regions 33$a$, 33$b$ (FIG. 4A) to be formed.

After the formation of the first sidewall spacers, moderately doped source/drain regions 33$a$, 33$b$, 33$a$' and 33$b$', and pocket implant regions 31$a$, 31$b$, 31$a$' and 31$b$' are formed as shown in FIGS. 3A and 3B by employing additional masking and sequential implantation steps. For example, moderately doped (N) source/drain regions 33$a$ and 33$b$, and lightly doped P-type pocket regions 31$a$ and 31$b$ are formed by masking and sequentially implanting the NMOS transistor according to the following implant conditions:

Moderately doped (N) source/drain implant (33$a$, 33$b$): arsenic, $E$=60KeV, $Q$(dose)=(3×10$^{13}$–1×10$^{14}$)cm$^{-2}$.

P-type pocket implant (31$a$, 31$b$): boron,

θ=(15°–45°), $E$=(20–60)KeV, $Q$(dose)=(0.5–1.0)×10$^{13}$ cm$^{-2}$.

Similarly, moderately doped (P) source/drain regions 33$a$' and 33$b$', and lightly doped N-type pocket regions 31$a$' and 31$b$' are formed for PMOS transistors by masking and sequentially implanting according to the following conditions:

Moderately doped (P) source/drain implant (33$a$', 33$b$'): $BF_2$.

$E$=30KeV, $Q$(dose)=(3×10$^{13}$–1×10$^{14}$)cm$^{-2}$.

N-type pocket implant (31$a$', 31$b$'): phosphorous,

θ=(15°–45°), $E$=(50–100)KeV, $Q$(dose)=(0.5–1.0)×10$^{13}$ cm$^{-2}$.

Figure 4A:
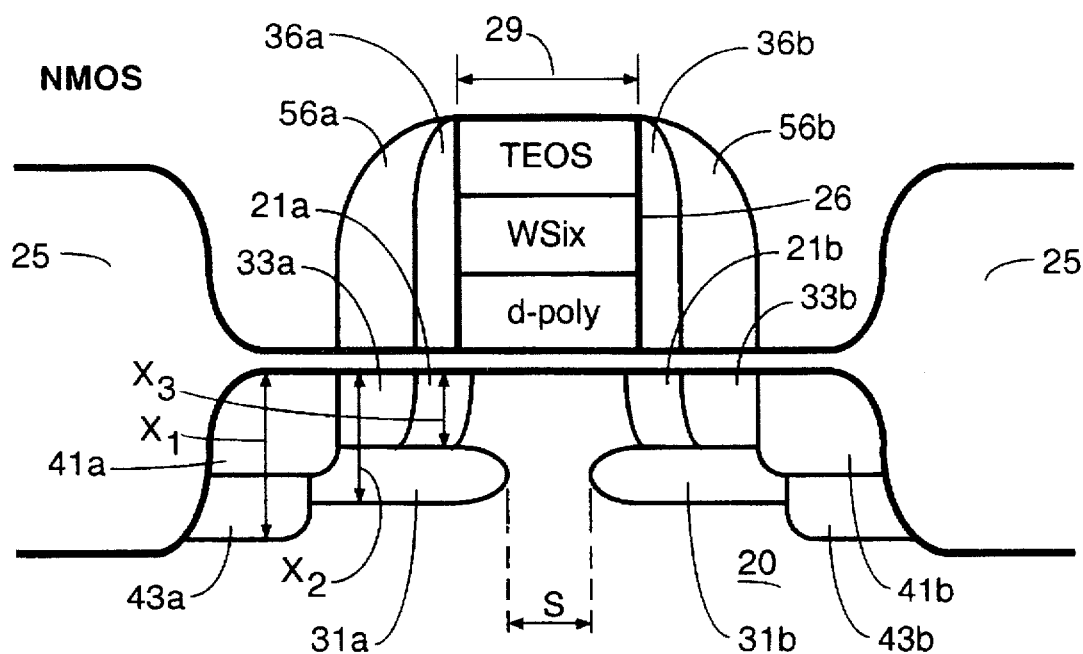

Unlike conventional techniques for manufacturing CMOS transistors, the transistor of the present invention utilizes horizontally graded source/drain regions which comprise a relatively linear continuum of doped regions, ranging from lightly doped (N–) regions 21$a$–$b$, to moderately doped (N) regions 33$a$–$b$, to heavily doped (N+) regions 41$a$–$b$ as shown in FIG. 4A. In order to form the moderately doped source/drain (MDD) regions, it is preferable to use a dopant concentration which is higher than the dopant concentration of the LDD implant. Additionally, the implant characteristics of the dopant concentration of the moderately doped source/drain regions should preferably be calculated to reduce source/drain resistance and to enhance current drive capability without compromising hot-carrier immunity. The implant conditions described above satisfy such objectives.

To form localized pocket regions 31a–b, 31a'–b', a Large Tilted-Angle Implant (LATI) process is used. The implant energy and dopant concentration is preferably chosen to ensure that the pocket regions are formed underneath the LDD and MDD regions without any portion of the pocket implant extending into the conduction channel (which extends laterally between the source and drain near the surface of the substrate under the gate). By forming pocket implants in accordance with the above-described technique, the transistor of the present invention offers the unexpected benefit of increased suppression of short channel effects and deterioration of punch-through characteristics without compromising conduction channel length control, current-drive capability, and/or hot-carrier immunity.

Figure 4B:
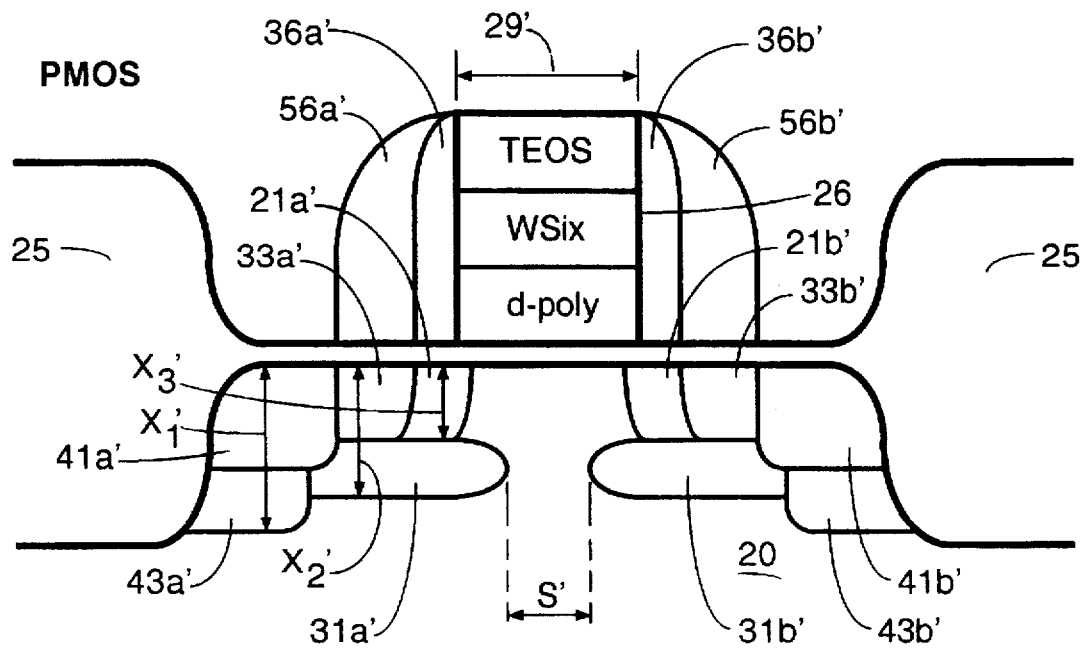

Next, as shown in FIGS. 4A and 4B, second sidewall oxide spacers 56a–b, 56a'–b' are formed simultaneously by deposition and then plasma etch back. Each of the second oxide spacers may have a thickness ranging from about 1500 Å to about 2000 Å.

After formation of the second sidewall spacers, source/drain regions 41a, 43a, 41b, and 43b (and corresponding regions in the PMOS transistor) are formed as shown in FIGS. 4A and 4B by employing masking and sequential co-implantation steps. For example, graded heavily doped source/drain regions 41a–b and 43a–b are formed by masking and sequentially co-implanting the NMOS transistor according to the following co-implant conditions:

First Implant (N+) (41a, 41b): Arsenic,

Energy $(E)$=60 KeV, $Q$(dose)=$3\times10^{15}$;

Second Implant (N–) (43a, 43b): Phosphorus,

Energy $(E)$=(80–120)KeV, $Q$(dose)=$(1.0-3.0)\times10^{13}$.

It is to be noted that the conditions for the first implant utilize a high dopant concentration and a low implantation energy for forming regions 41a and 41b. On the other hand, the second implant conditions utilize a low dopant concentration and high implantation energy for forming regions 43a and 43b.

Similarly, graded, heavily doped source/drain regions 41a'–b', 43a'–b' are formed for PMOS transistors by masking and sequentially co-implanting according to the following co-implant conditions:

First Implant (P+) (41a', 41b'): BF$_2$,

Energy $(E)$=45 KeV, $Q$(dose)=$2\times10^{15}$;

Second Implant (P–) (43a', 43b'): Boron,

Energy $(E)$=(40–80)KeV, $Q$(dose)=$(1.0-3.0)\times10^{13}$.

To construct co-implant source/drain regions 41a, 43a, 41b, and 43b, in addition to conventional implant techniques for forming source/drain regions at low implant energy and high dosage concentration, a co-implant technique of the present invention is used. The co-implant technique uses a higher implantation energy and a lower dosage to form vertically graded source/drain regions with deeper junctions. The graded regions comprise a heavily doped (N+) source/drain region 41a–b, and a lightly doped (N–) source/drain region 43a–b. The co-implant (second implant) energy and dosage have been specifically selected to fully compensate for the doped pocket implant regions of opposite type dopant outside the sidewall spacers, without impacting the pocket implant regions (31a and 31b) under the sidewall spacers and the gate. In this way, the vertically graded source/drain regions of the present invention will ensure low junction leakage and low junction capacitance.

After formation of the graded source/drain regions 41a, 41b, 43a, and 43b, the resultant transistor (as, for example, shown in FIG. 4A) will include a lightly doped source/drain region 21a, 21b, a moderately doped source/drain region 33a, 33b, and a heavily doped source/drain region 41a, 41b. By including a moderately doped (MDD) region in between the lightly doped and the heavily doped regions, the transistor of the present invention provides the unexpected advantage of lowering the resistivity of the respective source/drain regions while simultaneously maintaining improved hot carrier immunity. The lowering of the resistivity of the respective source/drain regions is due primarily to the lightly doped region 21a and 21b being narrower in width than similar regions in conventional CMOS transistors.

In order to produce the final structure as shown in FIGS. 4A and 4B, an annealing step is performed on the device. The annealing process may be, for example, a furnace annealing step at 850° C. for twenty minutes in N$_2$, or a rapid thermal anneal (RTA) at 1,000° C. for twenty seconds.

FIGS. 4A and 4B illustrate one embodiment of the transistor of the present invention which is conveniently described as a graded LDD transistor with localized pocket implants 31a, 31b, 31a' and 31b'. Also shown in FIGS. 4A and 4B are various measurements for indicating the junction depth of specific doped regions within a transistor. For example, variables $x_1$ and $x_1$' measure the junction depth of the graded heavily doped source/drain regions. Variables $x_2$ and $x_2$' measure the junction depth of the localized pocket (HALO) implant regions. Variables $x_3$ and $X_3$' measure the junction depth of graded lightly doped source/drain regions. Variables s and s' measure the spacing between the source-side and the drain-side pocket implant regions.

For sub-0.5 micron technology, the preferred targeted dimensions of the above-described variables are as follows:

0.2 micron$\leq x_1$, $x_1$'(S/D junction)$\leq$0.25 microns, 0.05 microns$\leq x_3$, $x_3$'(LDD)$\leq$0.10 microns, $x_3$, $x_3$'(LDD)<$x_2$, $x_2$'(HALO)<$x_1$, $x_1$'(S/D) for optimized profile, $x_3$, $x_3$'(LDD)<$x_2$, $x_2$'(HALO) for improved suppression of short channel effect, s,s'<0.25 microns for gate length of 0.35 microns on drawn.

As shown for example in FIG. 4A, it is preferable for the depth of source/drain regions 43a, 43b (denoted by distance $x_1$) to be greater than the depth of the pocket implant regions 31a, 31b (denoted by distance $x_2$). By keeping the value $x_1$ greater than $x_2$, the transistor of the present invention offers the advantage of both reduced junction capacitance and reduced junction leakage.

It is to be noted that the pocket implant energy and the implant angle θ together define the HALO junction depth and the spacing between source and drain-side pocket regions 31a, 31b, 31a' and 31b'. The pocket implant dosage (Q) preferably compensates the opposite type of dopant in LDD areas 21a–b, 21a'–b', and thus allows reduction of the junction depth of the lightly doped source/drain regions. Higher Q(dosage) will improve punch-through characteristics and threshold voltage roll-off (short channel effect) due to shallower junction in LDD regions.

In the optimized HALO profile (defined by):

$X_3$, $X_3'(LDD) < x_2$, $x_2'(HALO) < x_1$, $x_1'(S/D)$, narrow spacing of s, s' (achieved by a combination of higher E and larger angle θ) improves bulk punch-through characteristics. However, it will also increase body factor, thereby reducing current drive capability. Minimum spacing of s and s' is preferable to maintain good punch-through and short channel characteristics without degradation on body factor and current drive capability.

The graded lightly doped drain transistors with localized pocket regions (shown in FIGS. 4A and 4B) provide the following advantages. First, the transistor of the present invention may be designed to have a channel length of 0.5 microns or less. Second, the transistor of the present invention significantly improves short channel characteristics while maintaining acceptable subthreshold leakage. Additionally, the transistor of the present invention allows for better control of the conduction channel length without degradation of either (1) body factor and current drive, and/or (2) source/drain (to substrate) junction characteristics (i.e., junction leakage), and without compromising hot carrier immunity. Since there is no increase in source/drain junction capacitance, there is no degradation on performance, unlike conventional fabricated CMOS devices. As a result, reliable deep/sub-half micron CMOS transistors with high performance can be constructed using the technique of the present invention. It is to be noted that junction capacitance is not a critical or important design constraint in long channel MOSFET transistors (i.e., transistors with a channel length of greater than 0.5 microns).

Graded LDD Transistor with Localized Pocket Implants and Punch-Through Barrier An alternate embodiment of the transistor of the present invention is illustrated in FIGS. 5 and 6. For convenience, this alternate embodiment can be described as a graded LDD transistor with localized pocket implants and punch-through barrier.

In order to further improve both punch-through characteristics without degradation on source/drain junction characteristics and current drive, an additional masking and implant step may be employed to create a punch-through barrier region under the active channel regions. The fabrication process for the graded LDD transistor with localized pocket implants and punch-through barrier is described below.

Figure 5A:
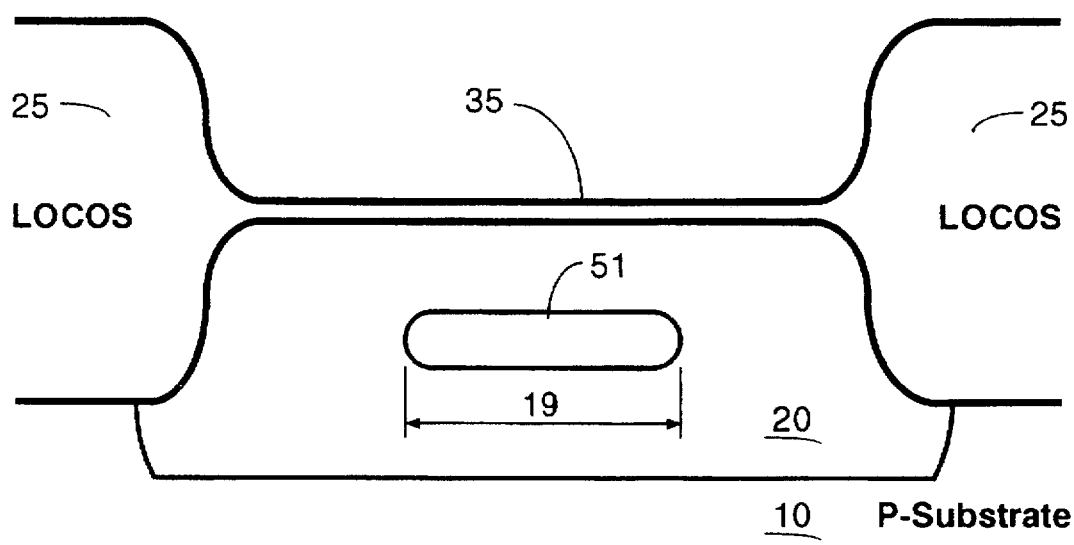
FIGS. 5–6 illustrate the technique for forming an alternate embodiment of the transistor of the present invention.
Figure 5B:
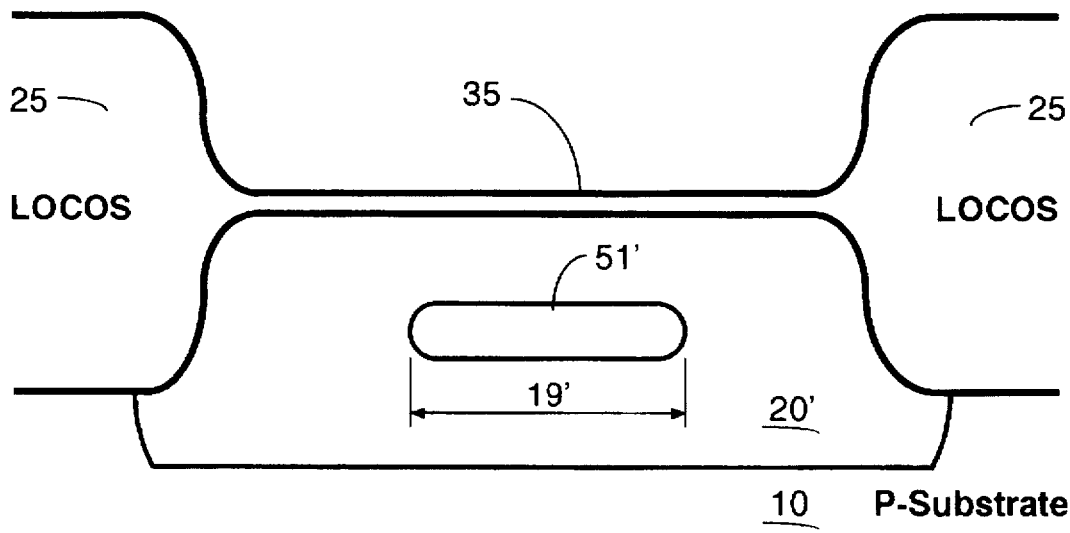

FIGS. 5A and 5B illustrate the localized punch-through barrier regions 51 and 51' formed after implantation and drive-in. These punch-through barrier regions 51 and 51' are formed sequentially by first masking and then implanting P- and N-type dopants into the substrate 20 and 20' for NMOS and PMOS transistors, respectively. The formation of the localized punch-through barriers 51 and 51' occurs after the threshold voltage implant step, but before the gate oxide formation step previously described above. Therefore, punch-through barrier regions 51 and 51' are also formed before transistor gate structure 26 is formed.

The implant conditions for P- and N-type punch-through barrier regions for respective NMOS and PMOS transistors are as follows. The P-type barrier for NMOS transistors is formed by implanting boron into substrate 20 at Energy(E) $=(60–120)$KeV, Q(dose)$=(1.0–5.0)\times 10^{13}$ cm$^{-2}$. The N-type barrier 51' for the PMOS transistor is formed by implanting phosphorous at E$=(90–180)$KeV, Q(dose)$=(1.0–5.0)\times 10^{13}$ cm$^{-2}$.

After the punch-through barrier regions have been implanted into the substrate, the subsequent fabrication steps of the transistor are substantially similar to those described previously for forming the graded LDD transistor with localized pocket implants. The final device structure according to this alternate embodiment is shown in FIGS. 6A and 6B.

It is to be noted that since punch-through barrier regions 51 and 51' are formed before the formation of the gate stack 26, it follows that regions 51 and 51' are not gate aligned, as are the other implanted regions in substrate 20 and 20'. Rather, the punch-through barrier regions are aligned using LOCOS regions 25.

However, in order to compensate for gate misalignment, tolerance must be incorporated into the length of regions 51 and 51'. The length of punch-through barrier 51 and 51' is defined by distance 19 and 19', respectively (FIGS. 5A and 5B). The lengths 19, 19' are preferably equal to the length 29 of the gate (FIG. 2) plus a two times the value of a gate misalignment tolerance (i.e. punch-through barrier region length=gate length (29)+2×(misalignment tolerance)). The misalignment tolerance may be, for example, about 0.1 microns.

Figure 6A:
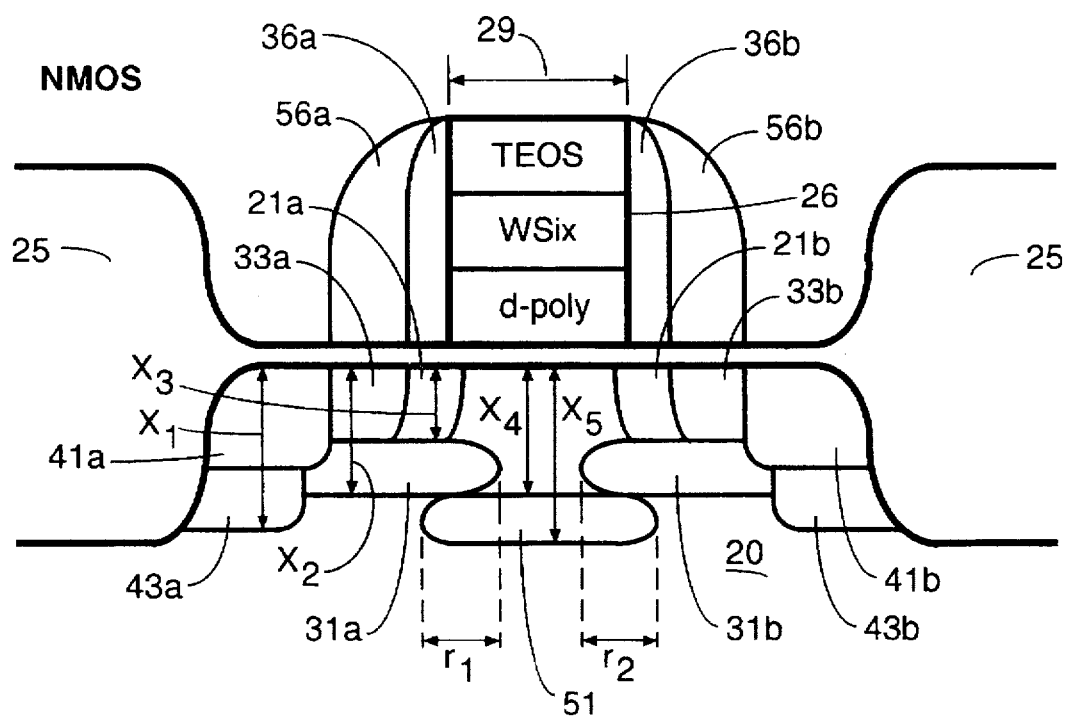
Figure 6B:
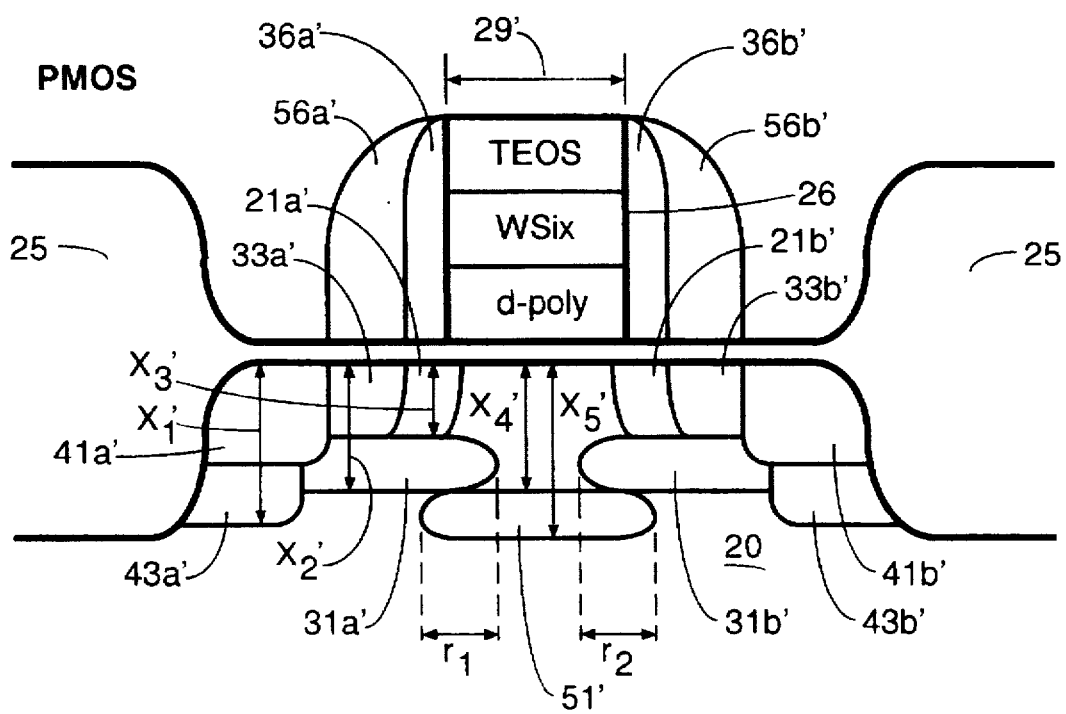
Figure 7A:
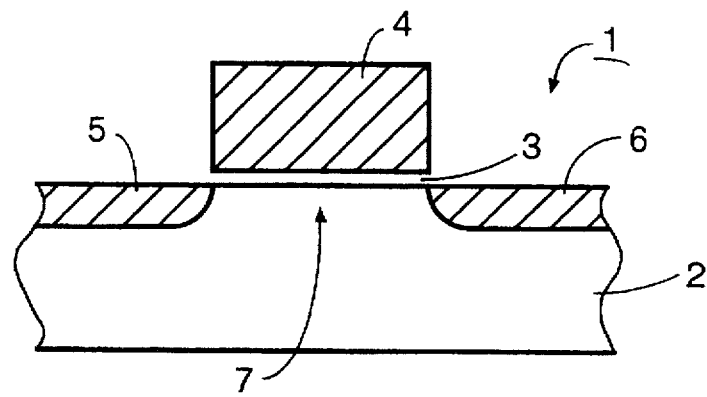
FIGS. 7A–C illustrate the conventional technique for forming a lightly doped drain (LDD) MOS transistor.
Figure 7B:
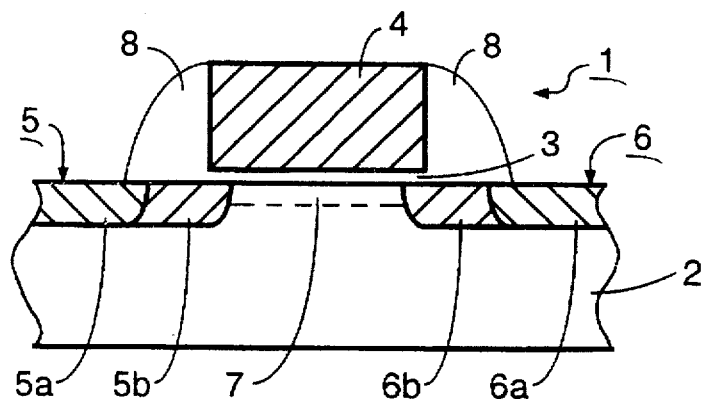
Figure 7C:
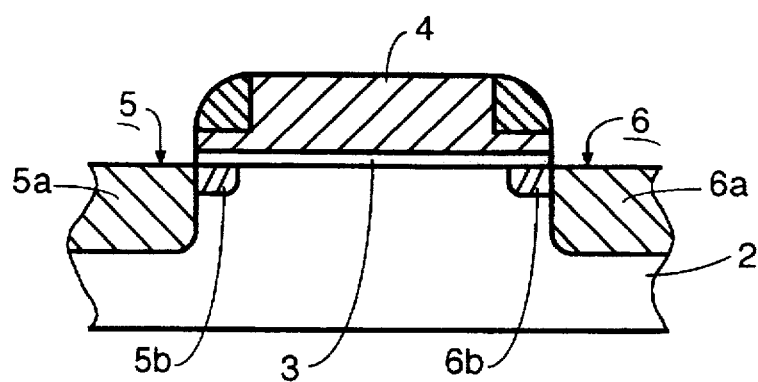

As shown in FIGS. 6A and 6B, distances $X_4$ and $x_5$ define the upper and lower bounds of punch-through barrier regions 51 and 51', respectively. It is to be noted that the upper and lower boundaries of punch-through barrier regions 51 and 51' are primarily defined by implant energy (E) and thermal budget. If desired, the device structures of FIGS. 5A and 5B may be annealed before the gate oxidation step is performed.

Referring back to FIGS. 6A and 6B, distances $r_1$, and $r_2$ define the overlap regions between pocket (source-side and drain-side) regions 31a, 31b and 31a', 31b', and punch-through regions 51 and 51', respectively. The optimized profile for each of the punch-through barrier regions 51 and 51' is defined by the following equation: $X_3$ (LDD)$<X_4 <X_2$ (pocket junction depth), where $x_5 > x_2$, and $r_1, r_2 \geq 0$ microns.

For example, in one embodiment, the length of the punch-through barrier 51 may be expressed as:

$=0.30$ microns (gate length)$+2\times 0.1$ microns (misalignment tolerance)

$=0.5$ microns.

It is to be noted that a shallower value for the distance $x_4$ will degrade body factor and current drive capability.

Silicided Source/Drain

In order to improve threshold voltage roll off and to reduce short-channel effect for sub-half micron transistors, shallow source/drain junctions are preferable (typically less than 0.15 microns), as described in the previous sections. However, for reduced source/drain junction (i.e., shallow junctions), the following parasitic device characteristics should preferably be addressed:

1. high diffusion resistance, and
2. deteriorated junction characteristics (i.e., leakage current).

Figure 8:
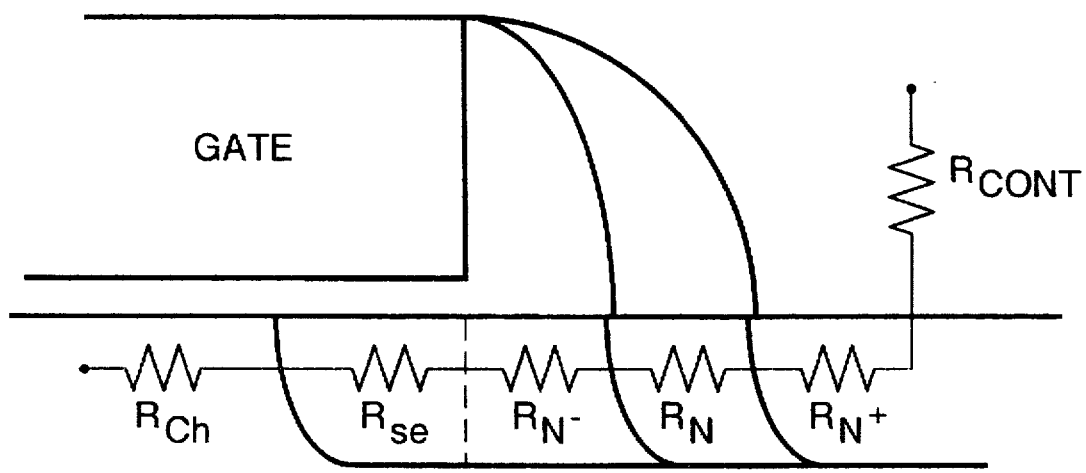
FIG. 8 illustrates the various factors which contribute to total source/drain resistance of a MOS transistor.

For sub-half micron geometry (i.e., design rules) contact resistance will dramatically increase, which together with high diffusion resistance will significantly increase total source/drain resistance, as shown, for example, in FIG. 8, which illustrates the various resistive elements which contribute to overall source/drain resistance.

As can be seen in FIG. 8, the drain portion of a n-channel MOS is shown, which has been formed according to the technique described in the parent application. As shown in FIG. 8, the total source/drain resistance of the transistor of the present invention can be expressed by the formula:

$R_{total}=R_{ch}+2*(R_{sp}+R_{n-}R_{n}+R_{n+}R_{cont})$, where $R_{ch}$=conduction channel resistance, $R_{sp}$=spreading resistance modulated by gate applied voltage in LDD region, $R_{n-}$=diffusion resistance beyond the gate in lightly doped (LDD) regions, $R_{n}$=diffusion resistance in moderately doped (MDD) source/drain regions, $R_{n+}$=diffusion resistance in heavily doped source/drain regions, and $R_{cont}$=contact resistance (which is dependent upon contact size and contact metallization).

It is to be noted that for ULSI products, in order to maintain flexibility and routability for design libraries, only a minimum number of contacts are allowed for each individual transistor. Because of this, the current drive of the transistor is severely degraded due to high contact resistance and diffusion resistance.

In order to resolve the above-described problems, the following solutions are proposed. First, to resolve the problem of high contact/diffusion resistance, silicidation of source/drain regions is proposed. Second, to solve the problem of deteriorated source/drain junction characteristics, graded source/drain regions are proposed which overlap with the heavily doped source/drain regions 41a–b and 41a'–b', respectively. Such graded regions (i.e. co-implantation regions) are discussed in greater detail above with reference to FIGS. 6A and 6B.

Figure 9A:
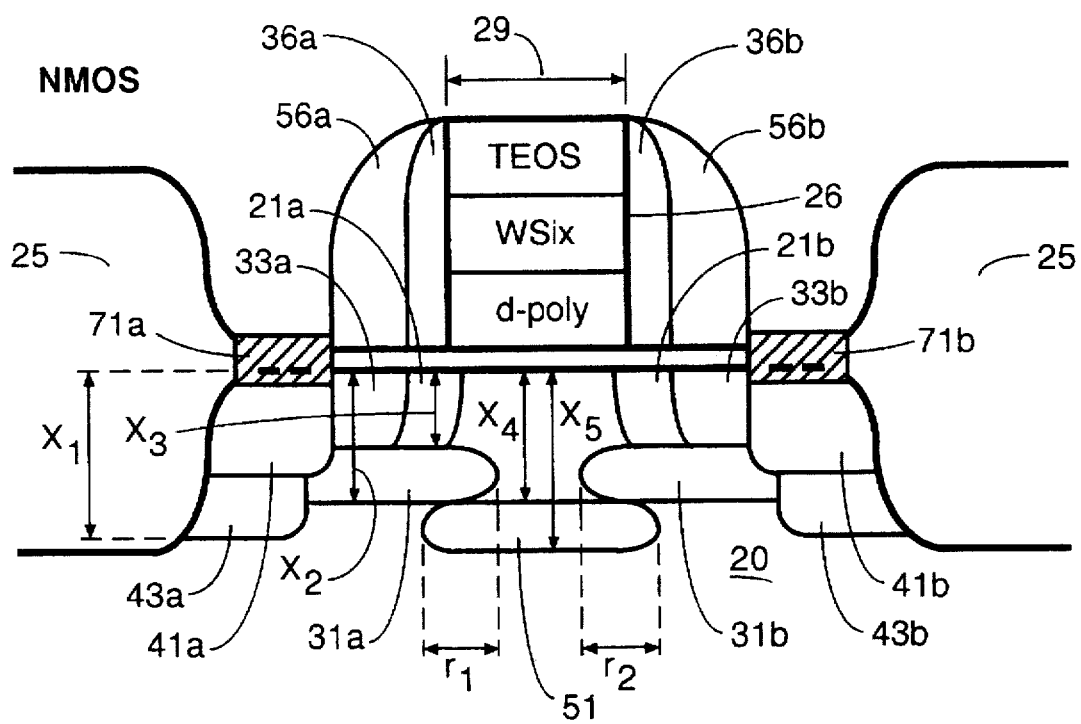
FIGS. 9A–B illustrate a third embodiment of the transistor of the present invention.
Figure 9B:
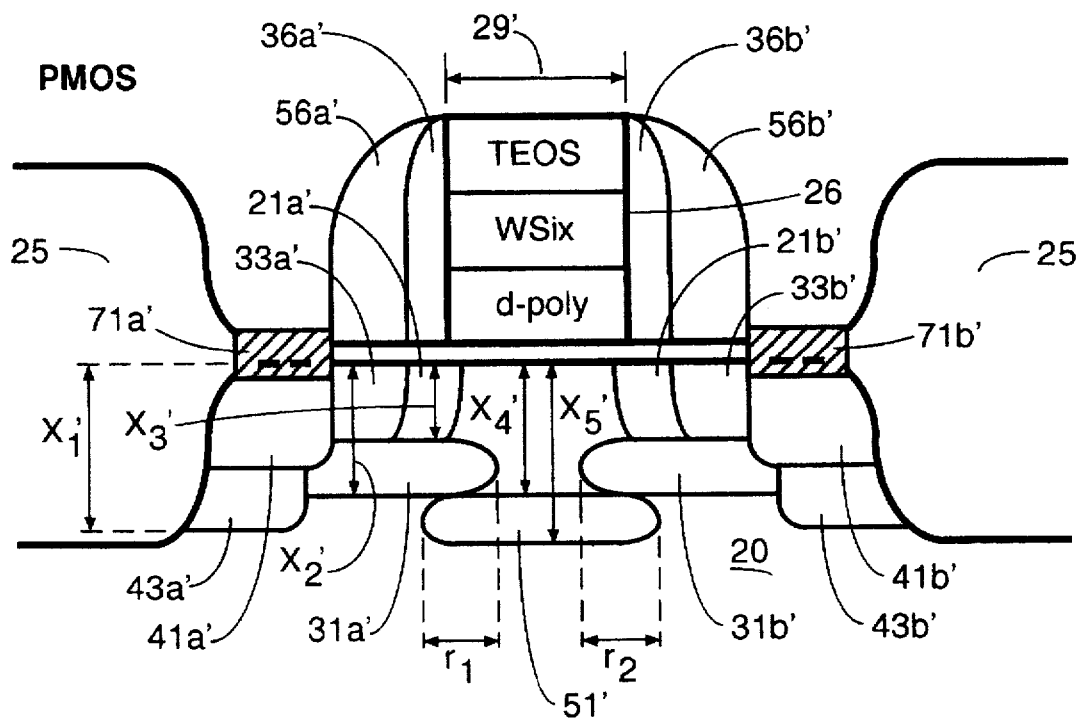

In order to form metal-silicide layers 71a–b, 71a'–b' on respective source/drain regions 41a–b and 41a'–b', as shown in FIGS. 9A and 9B, the thin oxide layer over the respective source/drain regions is removed by a wet-dip process in diluted HF and a thin metal layer is then deposited, followed by a low temperature anneal process, to thereby form a metal-silicide on the exposed source/drain regions. The unreacted metal on the oxide surface is then removed by a chemical etch process. In order to reduce resistance of the metal-silicide, a second anneal step is performed at a higher temperature to complete silicidation on the graded source/drain junctions.

In a preferred embodiment, the metal layer deposited is titanium (Ti). It is to be understood, however, that other metals besides titanium may be used for the formation of the metal silicide. Preferably the type of metal used is a refractory metal such as, for example, titanium (Ti), tungsten (W), molybdenum (Mo), tantalum (Ta), platinum (Pt), chromium (Cr), nickel (Ni), or cobalt (Co).

Deposition of the metal layer may be achieved by a sputtering process or by a chemical vapor deposition (CVD) process. The thickness of the deposited metal layer is preferably about 200–400 Å. Removal of the excess metal may be achieved by a chemical etch process such as, for example, by using a mixture of $NH_4OH$ and $H_2O$, or a mixture of $H_2O_2$ and $H_2O$.

After deposition of the metal layer, a first, low temperature anneal step is performed in order to form the metal-silicide. During the low temperature anneal step, a rapid thermal anneal process may be employed according to the following conditions:

Temperature=(750–900)°C., time ($t$)=60 seconds in $N_2$.

After the first anneal step, a second anneal step may be performed in order to reduce resistance of the metal-silicide.

The second anneal step may also be a rapid thermal anneal process according to the following conditions:

Temperature=(850–900)°C., time ($t$)=30 seconds in $N_2$.

After the annealing steps, the metal silicide 71a–b and 71a'–b'(of FIGS. 9A and 9B) will be formed. The thickness of the metal silicide will preferably be about 2.4 X the thickness of the deposited metal layer. Using the conditions described above, the thickness of the titanium-silicide layer will be approximately (480–960) Å.

Once formed, silicide layers 71a–b provide the transistor of the present invention the advantages of reduced contact resistance and reduced current degradation. Such advantages become more important as the channel length of the device decreases below 0.5 microns.

Although several preferred embodiments of this invention have been described in detail herein with reference to the accompanying drawings, it is to be understood that the invention is not limited to these precise embodiments, and that various changes and modifications may be affected therein by one skilled in the art without departing from the scope or spirit of the invention as defined in the appended claims.

It is claimed:

1. A method for the fabrication of a semi-conductor device comprising the steps of:

(a) implanting a substrate with impurities of a first conductivity type to form an active region surrounded by an isolation region;

(b) implanting, before formation of a gate oxide layer region, and before formation of a gate electrode, impurities of said first conductivity type to form a punch-through barrier region of said first conductivity type beneath the surface of said substrate such that a substantial portion of the barrier region is located below the gate electrode once the gate electrode has been formed, said barrier region having impurities of a first concentration;

(c) forming a gate oxide layer region on a central portion of the active surface area over said barrier region;

(d) forming a gate electrode over said gate oxide layer region;

(e) implanting impurities of a first concentration into said substrate to form a first set of relatively low impurity concentration (LDD) regions in said substrate after formation of said gate electrode, the LDD region implant step being aligned by the gate electrode;

(f) a first set of sidewall spacers over said relatively low impurity concentration (LDD) regions;

(g) thereafter implanting impurities of a second concentration greater than said first concentration into said substrate, to form contiguous relatively moderate impurity concentration (MDD) regions in said substrate, horizontally adjacent to said relatively low impurity concentration (LDD) regions, the MDD region implant being aligned by the first set of sidewall spacers;

(h) thereafter forming a second set of sidewall spacers adjacent to said first set of sidewall spacers such that said first set of sidewall spacers are interposed between said second set of sidewall spacers and said gate electrode;

(i) implanting, after the formation of said second set of sidewall spacers, impurities of a third concentration greater than said second concentration into said substrate to form relatively high impurity concentration regions (HDD) in said substrate, the MDD region implantation step being aligned with said second set of sidewall spacers; and, (j) implanting impurities into said substrate to form co-implant regions, co-implant region being vertically adjacent to and under said HDD region in said substrate, the co-implant implantation step being aligned with the second set of sidewall spacers;

wherein the LDD region, MDD region, HDD region and the co-implant region implant steps form source and drain impurity regions, said source and drain impurity regions being spaced apart from each other at opposite ends of said gate electrode with a conduction channel region therebetween and wherein said co-implant region and HDD regions cause the source and drain impurity regions to be vertically graded.

2. The method of claim 1, further comprising the step of implanting impurities of said first conductivity type to form pocket implant regions of said first conductivity type beneath each of said source and drain impurity regions, said implantation formed at an angle between 15°–45° using a Large Tilted-Angle Implant (LATI) technique, each of said pocket implant regions being formed such that no portion of the pocket implant region extends into said conduction channel region.

3. The method of claim 2 wherein said step of the implanting of said punch-through barrier region includes the step of aligning the formation of said barrier region relative to said isolation region.

4. The method of claim 2 wherein said step of the implanting of said punch-through barrier region includes forming said barrier region to have a length approximately equal to a length of said gate electrode plus a misalignment value.

5. The method of claim 1, further comprising the step of forming a silicide region above said active surface area, on top of each of said HDD regions.

6. The method of claim 5, wherein said silicide region is formed by depositing a metal into a layer, wherein said metal is a refractory metal selected from the group consisting of Ti, W, Mo, Ta, Pt, Cr, Ni and Co.

7. The method of claim 6, wherein said silicide region is deposited to a thickness of between 200–400 Å, and further comprising the step of annealing said metal with a first rapid anneal having a temperature of 750°–900° C. for approximately 60 seconds.

8. The method of claim 7, further comprising the step of annealing said metal layer forming said silicide region with a second anneal having a temperature of 850°–900° C. for approximately 30 seconds.

9. The method of claim 1, further comprising the step of implanting impurities of a first conductivity type opposite to that deposited in the co-implant region implant step to form pocket implant regions of said first conductivity type beneath the MDD region.

10. The method of claim 9, wherein the pocket implant is formed at an angle and aligned with one of the sidewall spacers.

11. A method for fabricating a dual well semi-conductor device, comprising the steps of:

(a) providing a substrate, forming in said substrate at least one well region, said at least one well region having an active surface area;

(b) forming a gate insulating layer and a gate electrode over said gate insulating layer on a central portion of the active surface area;

(c) implanting impurities of a first concentration into said substrate to form relatively low impurity concentration (LDD) regions, the LDD region implantation being aligned by the gate electrode;

(d) forming a first set of sidewall spacers adjacent to said gate electrode;

(e) thereafter implanting impurities of a second concentration greater than said first concentration into said substrate, to form contiguous relatively moderate impurity concentration (MDD) regions in said substrate, horizontally adjacent to said relatively low impurity concentration (LDD) regions, the MDD region implantation being aligned by the first set of sidewall spacers;

(f) forming a second set of sidewall spacers adjacent to said first set of sidewall spacers such that said first set of sidewall spacers are interposed between said second set of sidewall spacers and said gate electrode;

(g) implanting, after the formation of said second set of sidewall spacers, impurities a third concentration greater than said second concentration into said substrate to form relatively high impurity concentration regions (HDD) in said substrate, horizontally adjacent to said relatively moderate impurity concentration (MDD) regions and lying outside said gate electrode outside said second set of sidewall spacers, the HDD region implantation being aligned by the second set of sidewall spacers;

(h) implanting impurities of a lower dose than the HDD region into said substrate to form a co-implant region, vertically adjacent to and under said HDD region in said substrate, the co-implant region being aligned by the second set of sidewall spacers; and wherein the LDD region, MDD region, HDD region and the co-implant region implant steps form source and drain impurity regions, said source and drain impurity regions being spaced apart from each other at opposite ends of said gate electrode with a conduction channel region therebetween; and wherein said co-implant region and HDD region forming a vertically graded source/drain region.

12. The method of claim 11 wherein the well forming process of step (a) includes implanting impurities through a retrograde well formation process.

13. The method of claim 11, further comprising the step of implanting impurities of a first conductivity type opposite to that deposited in the co-implant region implant step to form pocket implant regions of said first conductivity type beneath the MDD region.

14. The method of claim 13, wherein the pocket implant is formed at an angle and aligned with one of the sidewall spacers.

15. The method of claim 11, further comprising the step of forming a silicide region above said active surface area, on top of each of said HDD regions.

16. The method of claim 15, wherein said silicide region is formed by depositing a metal into a layer, wherein said metal is a refractory metal selected from the group consisting of Ti, W, Mo, Ta, Pt, Cr, Ni and Co.

17. The method of claim 16, wherein said silicide region is deposited to a thickness of between 200–400 Å, and further comprising the step of annealing said metal with a first rapid thermal anneal having a temperature of 750°–900° C. for approximately 60 seconds.

18. The method of claim 17, further comprising the step of annealing said metal layer forming said silicide region with a second anneal having a temperature of 850°–900° C. for approximately 30 seconds.

19. The method of claim 11, wherein the step (h) further comprises:

implanting said co-implant region with impurities having the following properties: in a P-type well, said impurities of said co-implant region being N-type impurities and having an implant energy (E) of between 80–120 KeV, and a concentration dose (Q) of $1.0–3.0 \times 10^{13}$ ions/cm$^2$; in an N-type well, said impurities of said co-implant region being P-type impurities and having an implant energy (E) of 40–80 KeV and a concentration dose (Q) of $1.0–3.0 \times 10^{13}$ ions/cm$^2$.

20. The method of claim 11, further comprising the step of implanting impurities of a first conductivity type opposite to that deposited in the LDD region implant step to form pocket implant regions of said first conductivity type beneath each of said source and drain impurity regions, said implantation formed at an angle between 15°–45° using a Large Tilted-Angle Implant (LATI) technique, each of said pocket implant regions being formed such that no portion of the pocket implant region extends into said conduction channel region.

21. The method of claim 20, wherein in the step of forming said pocket implant regions the impurities have the following properties: in a P-type well, the P-type impurities forming said pocket implant regions have an implant energy (E) of between 20–60 KeV, a concentration dose (Q) of $0.5–1.0 \times 10^{13}$ ions/cm$^2$ and a LATI angle of 15°–45° degrees; in an N-type well, the N-type impurities forming said pocket implant regions have an implant energy (E) of between 50–100 KeV, a concentration dose (Q) of $0.5–1.0 \times 10^{13}$ ions/cm$^2$ and a LATI angle of 15°–45° degrees.

22. The method of claim 20, wherein said implantation of impurities in said LDD, HDD and pocket implant regions occurs to the following dimensions, as measured from the surface of said semiconductor device to the furthest boundary of each of said regions, where:

each said HDD region is formed to a depth X1 in the range 0.2 microns $\leq$ X1 $\leq$ 0.25 microns;

each said pocket implant region is formed to a depth X2 where X2<X1;

each said LDD region is formed to a depth X3 in the range 0.05 microns $\leq$ X3 $\leq$ 0.10 microns, and where X3<X2<X1;

and further wherein said source and drain impurity regions are separated by a gate having a length of less than 0.5 microns.

23. The method of claim 20, further comprising the step of implanting, before formation of a gate electrode, impurities of said first conductivity type to form a punch-through barrier region beneath the surface of said substrate such that a substantial portion of the barrier region is located below the gate electrode once the gate electrode has been formed, said barrier region being separate and distinct from said pocket implant regions.

24. The method of claim 23, wherein in the step of implanting said impurities of said first conductivity type to form said punch-through barrier the impurities have the following properties: in a P-type well, the P-type impurities forming said punch-through barrier have an implant energy (E) of between 60–120 KeV, and a concentration dose (Q) of $1.0–5.0 \times 10^{13}$ ions/cm$^2$; in an N-type well, the N-type impurities forming said punch-through barrier have an implant energy (E) of 90–180 KeV and a concentration dose (Q) of $1.0–5.0 \times 10^{13}$ ions/cm$^2$.

25. The method of claim 11, further comprising the step of implanting, before formation of a gate electrode, impurities of said first conductivity type to form a punch-through barrier region beneath the surface of said substrate such that a substantial portion of the barrier region is located below the gate electrode once the gate electrode has been formed.

26. The method of claim 25, wherein in the step of implanting said impurities of said first conductivity type to form said punch-through barrier region the impurities have the following properties: in a P-type well, the P-type impurities forming said punch-through barrier have an implant energy (E) of between 60–120 KeV, and a concentration dose (Q) of $1.0–5.0 \times 10^{13}$ ions/cm$^2$; in an N-type well, the N-type impurities forming said punch-through barrier have an implant energy (E) of 90–180 KeV and a concentration dose (Q) of $1.0–5.0 \times 10^{13}$ ions/cm$^2$.

27. The method of claim 11, further comprising the step of implanting, before formation of a gate electrode, impurities of a first conductivity type opposite to that deposited in the LDD region implant step to form a punch-through barrier region beneath the surface of said substrate such that a substantial portion of the barrier region is located below the gate electrode once the gate electrode has been formed.

28. The method of claim 27, wherein in the step of implanting said impurities of said first conductivity type to form said punch-through barrier region the impurities have the following properties: in a P-type well, the P-type impurities forming said punch-through barrier have an implant energy (E) of between 60–120 KeV, and a concentration dose (Q) of $1.0–5.0 \times 10^{13}$ ions/cm$^2$; in an N-type well, the N-type impurities forming said punch-through barrier have an implant energy (E) of 90–180 KeV and a concentration dose (Q) of $1.0–5.0 \times 10^{13}$ ions/cm$^2$.

29. The method of claim 27, further comprising the step of forming a silicide region above said active surface area, on top of each said HDD regions.

30. The method of claim 29, wherein said silicide region is formed by a metal into a layer, wherein said metal is a refractory metal selected from the group consisting of Ti, W, Mo, Ta, Pt, Cr, Ni and Co.

31. The method of claim 30, wherein said silicide region is deposited to a thickness of between 200–400 Å, and further comprising the step of annealing said metal with a first rapid thermal anneal having a temperature of 750°–900° C. for approximately 60 seconds.

32. The method of claim 31, further comprising the step of annealing said metal layer forming said silicide region with a second anneal having a temperature of 850°–900° C. for approximately 30 seconds.

33. The method of claim 11, further comprising the step of forming pocket implant regions using impurities of a first conductivity type opposite to that deposited in the LDD region implant step beneath each of said source and drain impurity regions using a Large Tilted-Angle Implant (LATI) technique, each of said pocket implant regions being formed such that no portion of the pocket implant region extends into said conduction channel region.

34. The method of claim 11, further comprising the step of forming a silicide region above said active surface area, on top of each of said HDD regions.

35. The method of claim 34, wherein said silicide region is formed by depositing a metal into a layer, wherein said metal is a refractory metal selected from the group consisting of Ti, W, Mo, Ta, Pt, Cr, Ni and Co.

36. The method of claim 35, wherein said silicide region is deposited to a thickness of between 200–400 Å, and further comprising the step of annealing said metal with a first rapid thermal anneal having a temperature of 750°–900° C. for approximately 60 seconds.

37. The method of claim 36, further comprising the step of annealing said metal layer forming said silicide region with a second anneal having a temperature of 850°–900° C. for approximately 30 seconds.

38. The method of claim 33, wherein in the step of forming said pocket implant regions the impurities have the following properties: in a P-type well, the P-type impurities forming said pocket implant regions have an implant energy (E) of between 20–60 KeV, a concentration dose (Q) of $0.5-1.0 \times 10^{13}$ ions/cm$^2$ and a LATI angle of 15°–45° degrees; in an N-type well, the N-type impurities forming said pocket implant regions have an implant energy (E) of between 50–100 KeV, a concentration dose (Q) of $0.5-1.0 \times 10^{13}$ ions/cm$^2$ and a LATI angle of 15°–45° degrees.

39. The method of claim 11, wherein in said step (a):
the impurities in said implantation of P-type and N-type impurities to form a P-type well region and said N-type well region have the following properties: for an N-well, said impurities implanted with an implant energy (E) of about 360 KeV, and a concentration dose (Q) of between $1.0-2.0 \times 10^{13}$ ions/cm$^2$; for said P-well, said impurities implanted with an implant energy (E) of about 200 KeV and a concentration dose (Q) of $0.5-1.5 \times 10^{13}$ ions/cm$^2$; and, thereafter said retrograde well formation process includes the step of subjecting said well regions to a substantially low temperature anneal process of about 1000° C.

* * * * *